United States Patent
Lin

(10) Patent No.: US 9,552,847 B2
(45) Date of Patent: Jan. 24, 2017

(54) ELECTRONIC DEVICE AND COVERING STRUCTURE

(71) Applicant: Wistron Corporation, New Taipei (TW)

(72) Inventor: Jim-Da Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 144 days.

(21) Appl. No.: 14/071,652

(22) Filed: Nov. 5, 2013

(65) Prior Publication Data

US 2015/0062857 A1    Mar. 5, 2015

(30) Foreign Application Priority Data

Sep. 5, 2013 (TW) .............................. 102132017 A

(51) Int. Cl.
  *G11B 33/14*  (2006.01)
  *G06F 1/18*   (2006.01)
  *H05K 9/00*   (2006.01)

(52) U.S. Cl.
  CPC .......... *G11B 33/1493* (2013.01); *G06F 1/182* (2013.01); *H05K 9/0018* (2013.01)

(58) Field of Classification Search
  CPC .. H05K 9/0018; H05K 7/1425; H05K 7/1418; H05K 7/1409; G11B 33/14; G06F 1/18; G06F 1/185; G06F 1/186
  See application file for complete search history.

(56) References Cited

U.S. PATENT DOCUMENTS

| | | | |
|---|---|---|---|
| 5,083,239 A * | 1/1992 | Sedlemeier et al. .......... | 361/816 |
| 5,090,117 A * | 2/1992 | Dickie ............................ | 29/840 |
| 5,191,544 A * | 3/1993 | Benck et al. ................. | 361/688 |
| 5,199,776 A * | 4/1993 | Lin ............................ | 312/293.3 |
| 5,770,822 A * | 6/1998 | Abolitz et al. ................ | 174/355 |
| 6,227,632 B1 * | 5/2001 | Liu ............................ | 312/223.2 |
| 6,390,320 B2 * | 5/2002 | Hurst et al. ................... | 220/241 |
| 6,483,024 B1 * | 11/2002 | Smithson et al. ............ | 174/354 |
| 6,731,518 B2 * | 5/2004 | Suzuki et al. ................ | 361/818 |
| 6,780,043 B2 * | 8/2004 | Malmberg .................... | 439/377 |
| 6,937,481 B1 * | 8/2005 | Newman et al. ............. | 361/801 |
| 6,954,354 B2 * | 10/2005 | Shyr ........................ | 361/679.33 |
| 7,168,772 B1 * | 1/2007 | Liang ........................ | 292/336.3 |

(Continued)

FOREIGN PATENT DOCUMENTS

EP           1643346          4/2006

OTHER PUBLICATIONS

"Office Action of Taiwan Counterpart Application" with partial English translation, issued on Jul. 24, 2015, p. 1-p. 7.

*Primary Examiner* — David M Sinclair
*Assistant Examiner* — Theron S Milliser
(74) *Attorney, Agent, or Firm* — Jianq Chyun IP Office

(57) ABSTRACT

An electronic device including a metal casing and a covering structure is provided. The metal casing has a first opening. The covering structure includes a cover and a conductive component. The cover is assembled to the metal casing and covers the first opening, wherein the cover has at least one hole. The conductive component is fixed to the cover and has at least one contacting portion, wherein the contacting portion passes through the hole and contacts the metal casing, and an electromagnetic wave is adapted to pass through the conductive component to be transmitted to the metal casing.

20 Claims, 10 Drawing Sheets

(56) References Cited

U.S. PATENT DOCUMENTS

| | | | |
|---|---|---|---|
| 7,327,585 B1* | 2/2008 | Fan et al. | 361/816 |
| 7,561,444 B2* | 7/2009 | He | 361/818 |
| 7,744,172 B2* | 6/2010 | Chen et al. | 312/223.2 |
| 7,768,787 B2* | 8/2010 | Vaughan et al. | 361/725 |
| 8,077,452 B2* | 12/2011 | Wang | 361/679.4 |
| 8,270,162 B2* | 9/2012 | Peng et al. | 361/693 |
| 8,644,034 B2* | 2/2014 | Zheng | 361/816 |
| 2003/0062181 A1* | 4/2003 | Festag | 174/35 GC |
| 2004/0120107 A1* | 6/2004 | Davis et al. | 361/683 |
| 2005/0116588 A1* | 6/2005 | Teng | 312/223.2 |
| 2005/0225958 A1* | 10/2005 | Lewis | 361/818 |
| 2007/0076402 A1* | 4/2007 | Chen et al. | 361/816 |
| 2008/0049411 A1* | 2/2008 | Wang et al. | 361/818 |
| 2008/0205026 A1* | 8/2008 | Gallarelli | H05K 9/0016 361/818 |
| 2009/0086421 A1* | 4/2009 | Olesiewicz et al. | 361/679.33 |
| 2010/0149746 A1* | 6/2010 | Crippen et al. | 361/679.33 |
| 2010/0288552 A1* | 11/2010 | Pedoeem et al. | 174/378 |
| 2011/0012484 A1* | 1/2011 | Chen et al. | 312/223.2 |
| 2011/0310554 A1* | 12/2011 | Hiyama | 361/679.58 |
| 2012/0229963 A1* | 9/2012 | Lin | 361/679.01 |
| 2013/0027890 A1* | 1/2013 | Berger et al. | 361/747 |
| 2014/0340864 A1* | 11/2014 | Wu et al. | 361/818 |

\* cited by examiner

ELECTRONIC DEVICE AND COVERING STRUCTURE

CROSS-REFERENCE TO RELATED APPLICATION

This application claims the priority benefit of Taiwan application serial no. 102132017, filed on Sep. 5, 2013. The entirety of the above-mentioned patent application is hereby incorporated by reference herein and made a part of this specification.

BACKGROUND OF THE INVENTION

Field of the Invention

The invention relates to an electronic device and a covering structure, and more particularly, to an electronic device and a covering structure having an electromagnetic interference shielding ability thereof.

Description of the Related Art

As technology advances, personal computers have been widely applied in work and life. The current common personal computers include desktop and notebook computers.

In terms of the personal computer, a casing of a host thereof generally has a reserved opening for facilitating an assembling an optical drive for expansion to the host, and then the opening is to be covered with a plastic cover. In addition, in order to prevent an electromagnetic wave generated by electronic components of the personal computer from causing an interference to other electronic devices and to avoid the electromagnetic wave from the outside from influencing the normal operation of the personal computer, a conductive component is usually being installed at the casing to cover the opening, so that the electromagnetic wave is able to be transmitted to the casing through the conductive component, thereby achieving an electromagnetic interference shielding effect. When a user is to install the optical drive for expansion to the host, the user has to firstly dissemble the plastic cover covering the opening of the casing and then to dissemble the conductive component, before installing the optical drive; and in some certain designs, the user even has to use tools to remove screws in order to smoothly perform the dissembling, and thus it is relatively time and labor costing.

SUMMARY OF THE INVENTION

The invention provides an electronic device with a covering structure having an electromagnetic interference shielding effect and being easily to be assembled and dissembled.

The invention provides a covering structure having an electromagnetic interference shielding effect and being easily to be assembled and dissembled.

The electronic device of the invention includes a metal casing and a covering structure. The metal casing has a first opening. The covering structure includes a cover and a conductive component. The cover is assembled to the metal casing and covers the first opening, wherein the cover has at least one hole. The conductive component is fixed to the cover and has at least one contacting portion, wherein the contacting portion passes through the hole and contacts the metal casing, and an electromagnetic wave is adapted to pass through the conductive component to be transmitted to the metal casing.

The covering structure of the invention is adapted to be applied to an electronic device. The electronic device includes a metal casing, and the metal casing has a first opening. The covering structure includes a cover and a conductive component. The cover is assembled to the metal casing and covers the first opening, wherein the cover has at least one hole. The conductive component is fixed to the cover and has at least one contacting portion, wherein the contacting portion passes through the hole and contacts the metal casing, and an electromagnetic wave is adapted to pass through the conductive component to be transmitted to the metal casing.

In an embodiment of the invention, the conductive component has a conductive elastic piece, and the contacting portion is formed on the conductive elastic piece.

In an embodiment of the invention, the cover has an elastic arm and an engagement portion, the engagement portion is formed on the elastic arm and engaged to the metal casing, and the elastic arm is adapted to be elastically deformed to drive the engagement portion away from the metal casing.

In an embodiment of the invention, the elastic arm has a pressing portion, and the pressing portion is adapted to be subjected to a force such that the elastic arm is elastically deformed.

In an embodiment of the invention, the engagement portion includes two engaging bumps, and an inner edge of the first opening of the metal casing is engaged between the two engaging bumps.

In an embodiment of the invention, the hole is formed between the two engaging bumps, and the contacting portion passes through the hole and contacts with the inner edge of the first opening.

In an embodiment of the invention, the engagement portion has an inclined guiding surface adapted to be engaged to the metal casing through a guidance of the inclined guiding surface.

In an embodiment of the invention, the electronic device further includes an external cover, wherein the first opening is formed on a surface of the metal casing, the external cover has a second opening and is assembled to the metal casing to cover the surface, and the second opening is aligned to the first opening and exposes the covering structure.

In an embodiment of the invention, the external cover has a positioning hole, and the cover has a positioning protrusion, and the positioning protrusion is positioned at the positioning hole.

In an embodiment of the invention, the cover is adapted to be rotated with the positioning protrusion as a fulcrum to cover the first opening or move away from the first opening.

According to the foregoing, in the covering structure of the invention, the conductive component is fixed to the cover and passes through the hole of the cover to contact the metal casing of the electronic device, so that the electromagnetic wave can be transmitted to the metal casing through the conductive component for achieving the electromagnetic interference shielding effect. When a user is to dissemble or assemble the cover and the conductive component, the conductive component fixed to the cover may together be removed from the metal casing by merely dissembling the cover from the metal casing, and the conductive component may be completely installed by merely assembling the cover to the metal casing, such that the dissembling and the assembling the covering structure are relatively easy.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
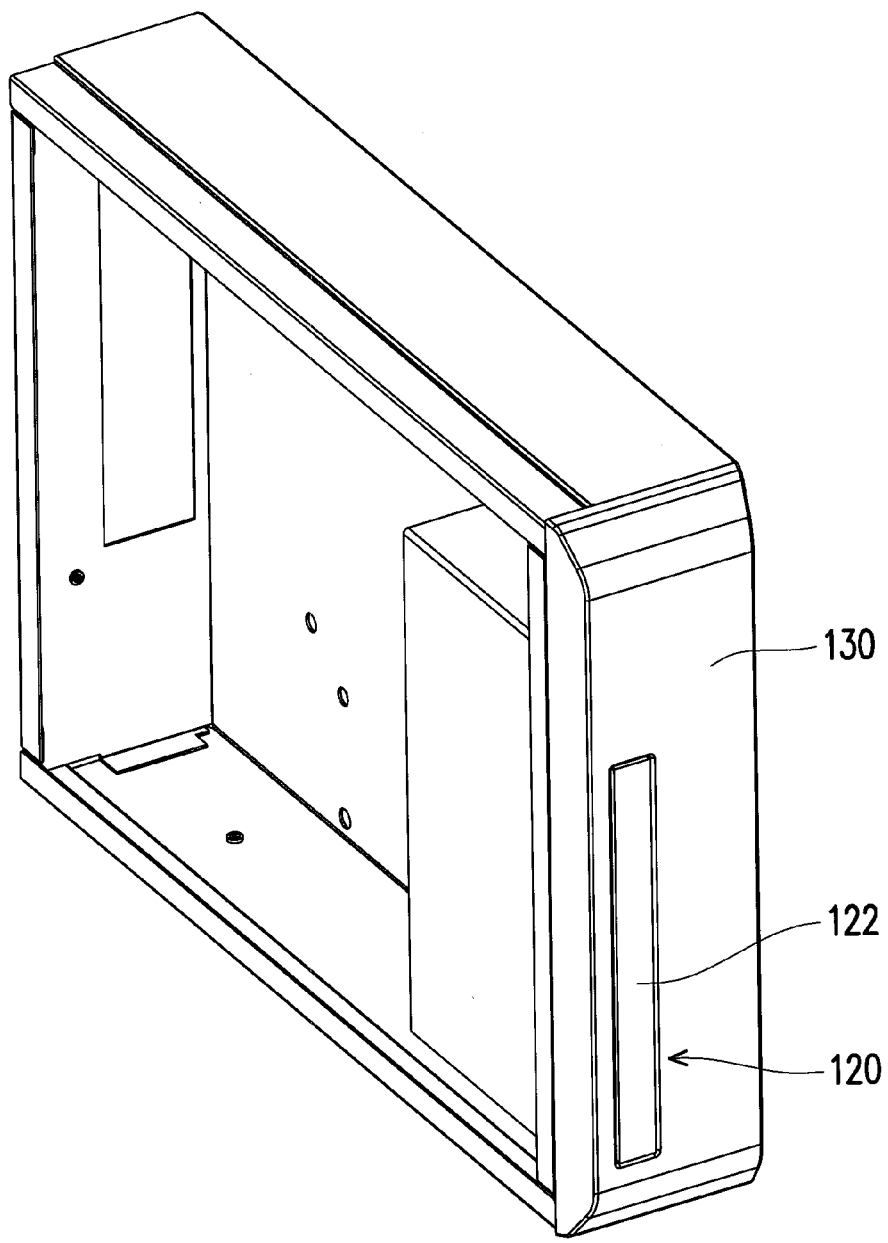
FIG. 1 is a perspective diagram illustrating partial components of an electronic device according to an embodiment of the invention.
Figure 2:
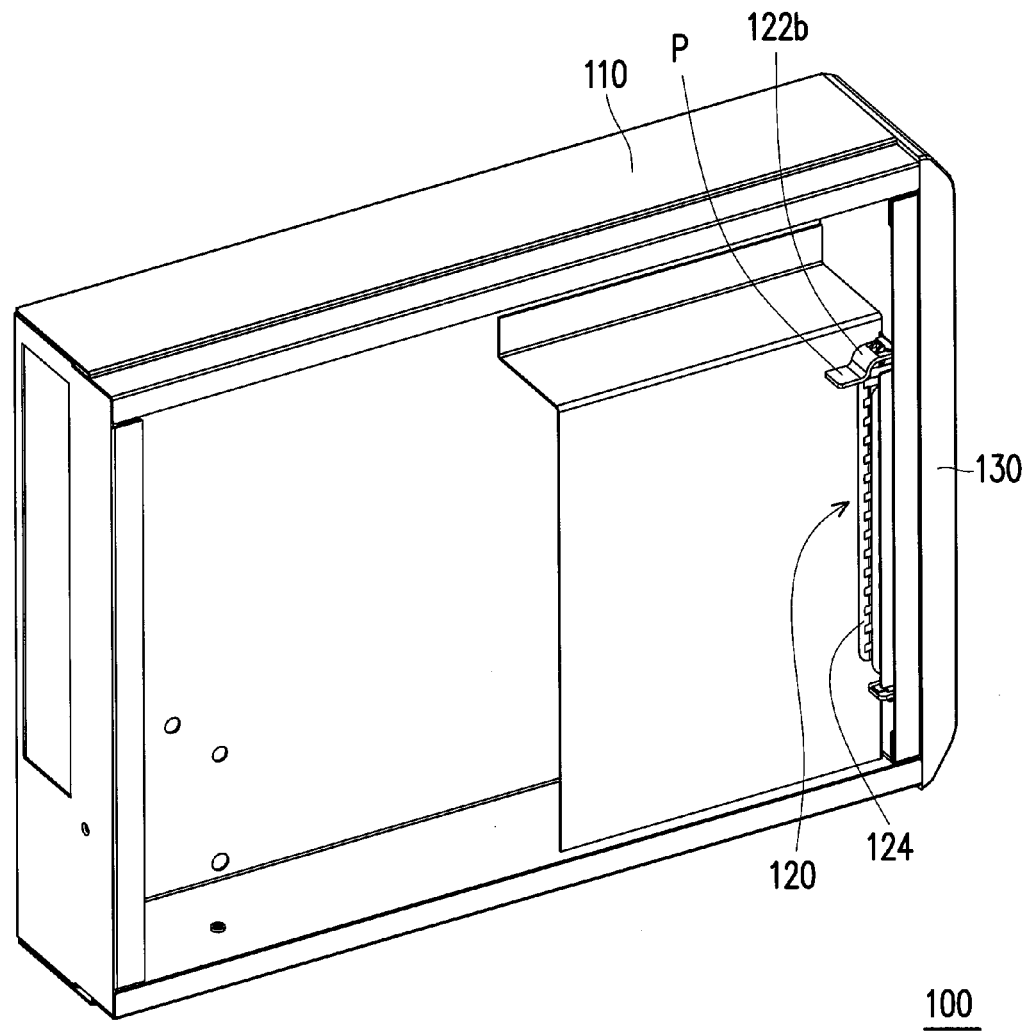
FIG. 2 is a perspective diagram illustrating the electronic device of FIG. 1 from another viewing angle.
Figure 3:
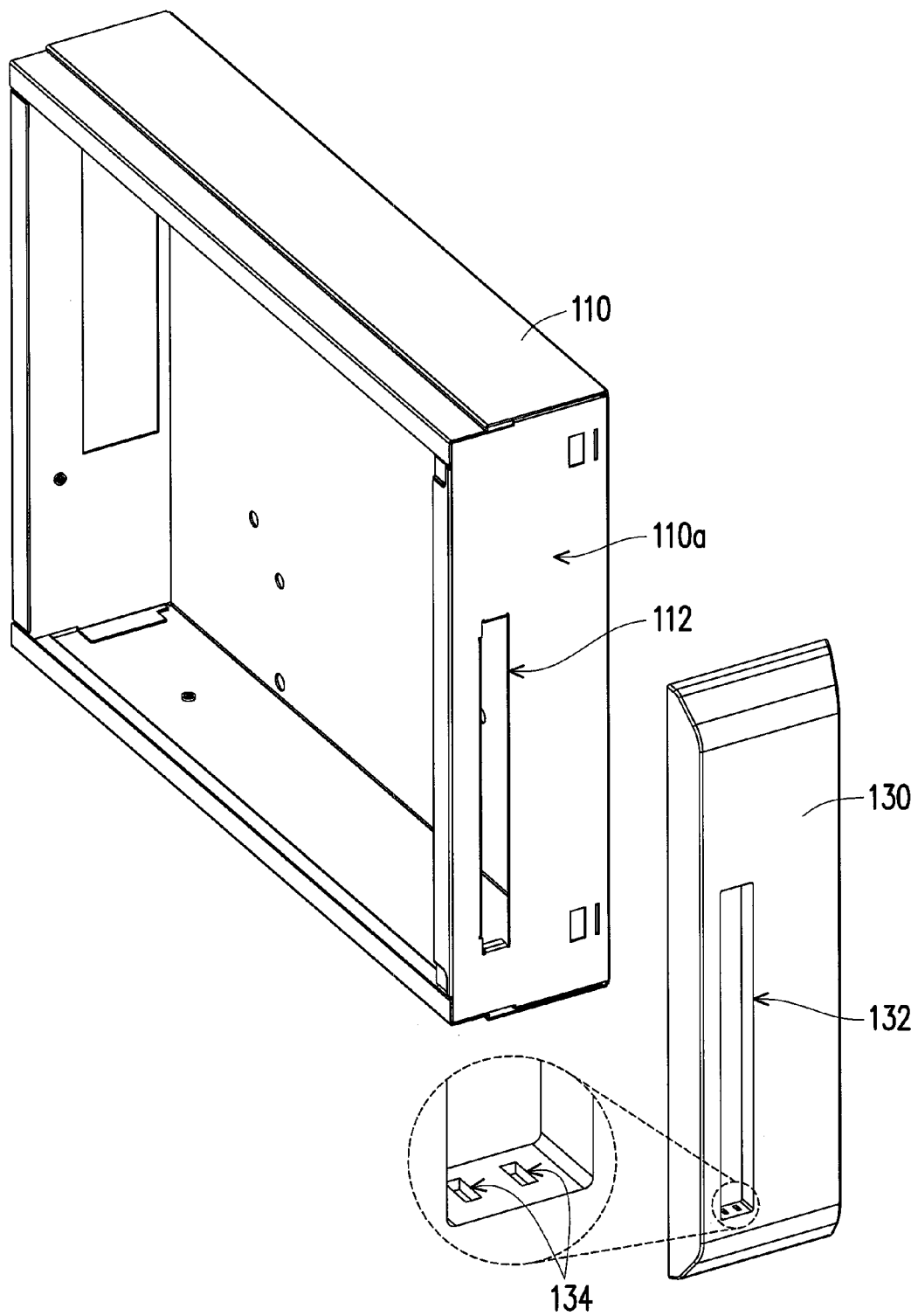
FIG. 3 is an exploded diagram of the metal casing and the external cover of FIG. 1.

FIG. 1 is a perspective diagram illustrating partial components of an electronic device according to an embodiment of the invention. FIG. 2 is a perspective diagram illustrating the electronic device of FIG. 1 from another viewing angle. FIG. 3 is an exploded diagram of the metal casing and the external cover of FIG. 1. Referring to FIG. 1 through FIG. 3, an electronic device 100 of the present embodiment, for example, is a host of a desktop computer, and for the clarity of the drawing, only partial components of the host are illustrated in FIG. 1 through FIG. 3. The electronic device 100 includes a metal casing 110, a covering structure 120 and an external cover 130. A surface 110a of the metal casing 110 has a first opening 112, the first opening 112, for example, is an opening reserved for installing an optical drive for expansion, and the covering structure 120 is configured to cover the first opening 112 and provide an electromagnetic interference shielding effect. The external cover 130 has a second opening 132 and is assembled to the metal casing 110 for covering the surface 110a, and the second opening 132 of the external cover 130 is aligned to the first opening 112 of the metal casing 110 and exposes the covering structure 120.

Figure 4:
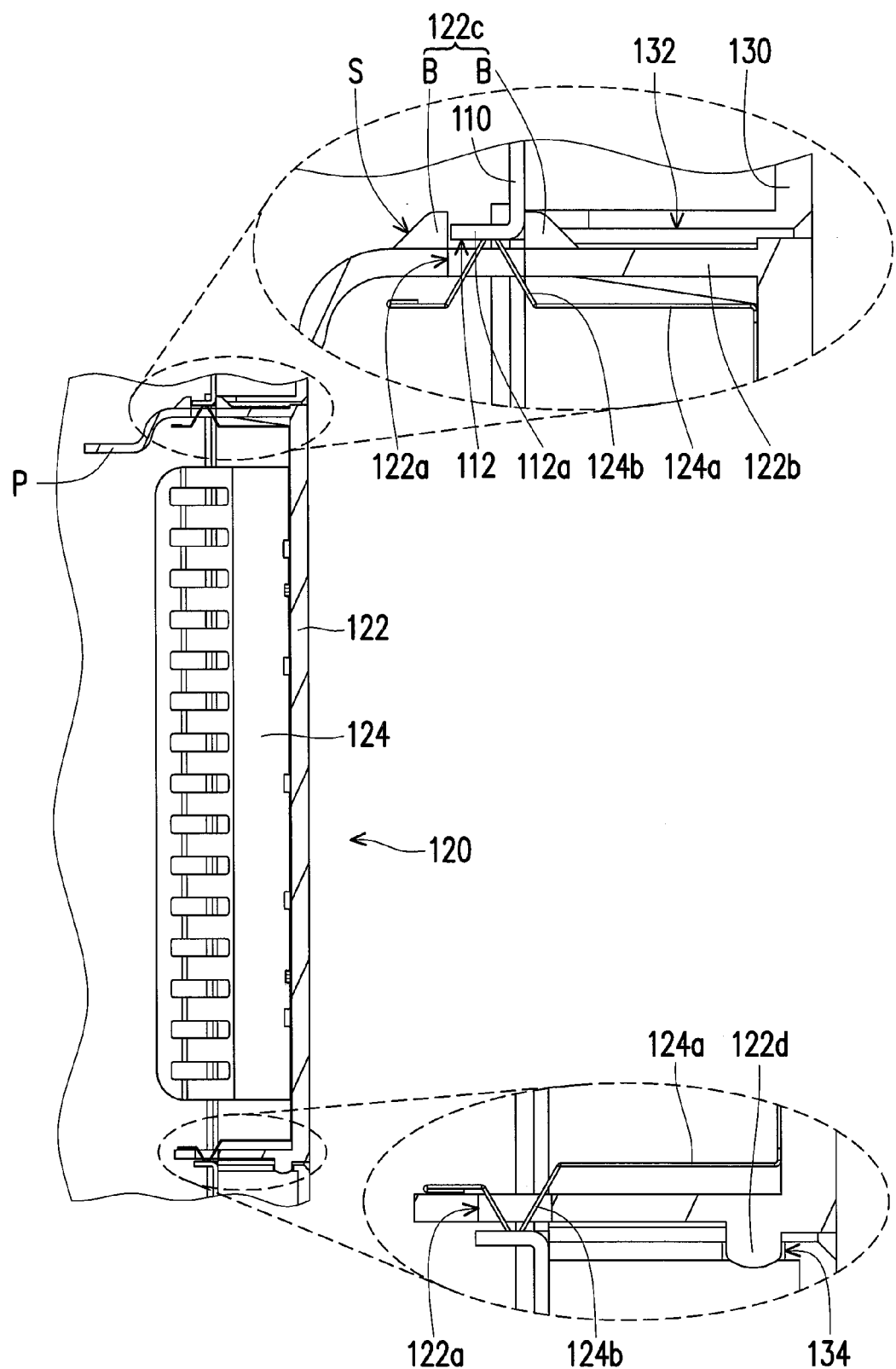
FIG. 4 is a partial cross-sectional diagram of the electronic device of FIG. 1.
Figure 5:
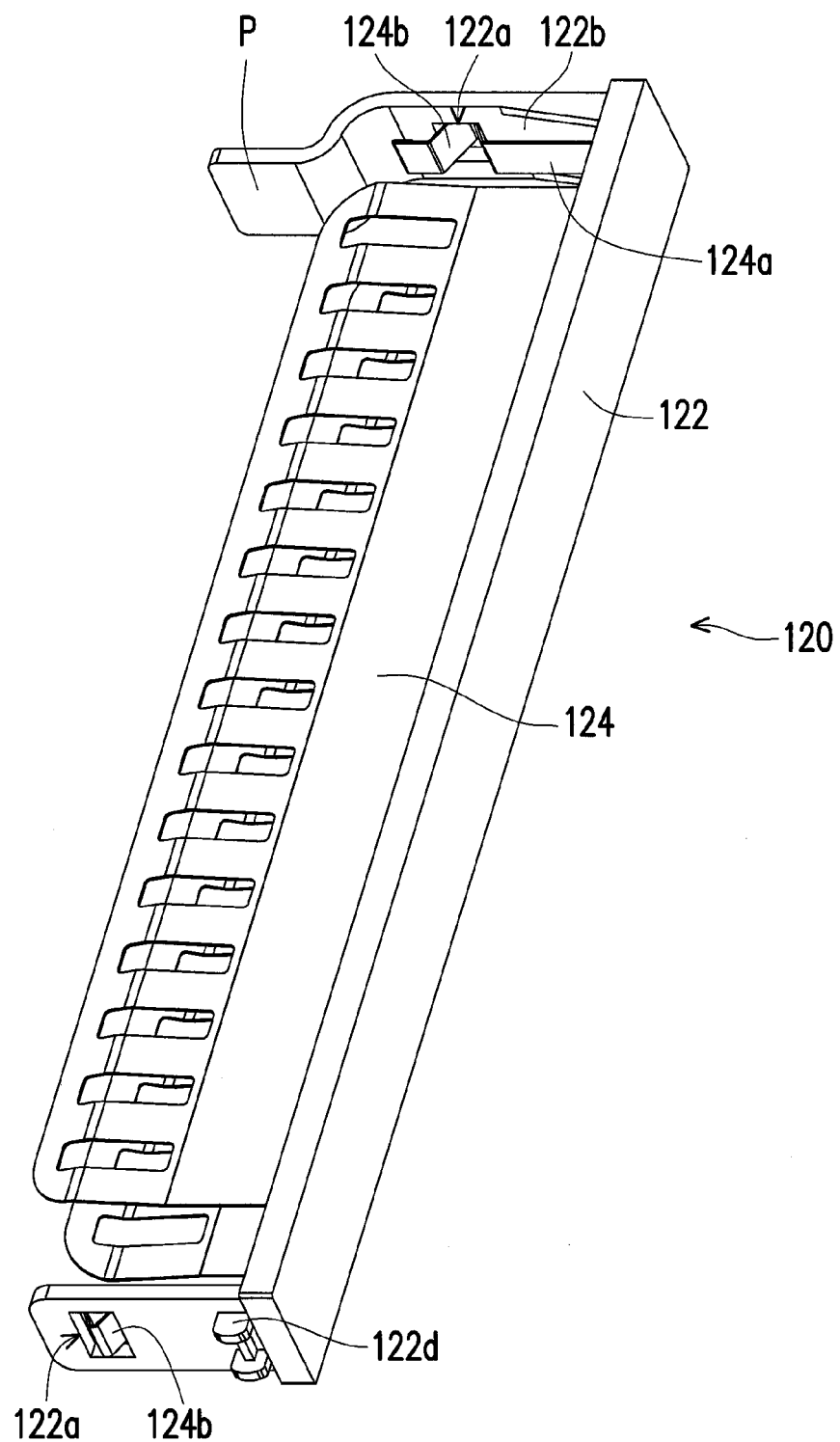
FIG. 5 is a perspective diagram of the covering structure of FIG. 1.
Figure 6:
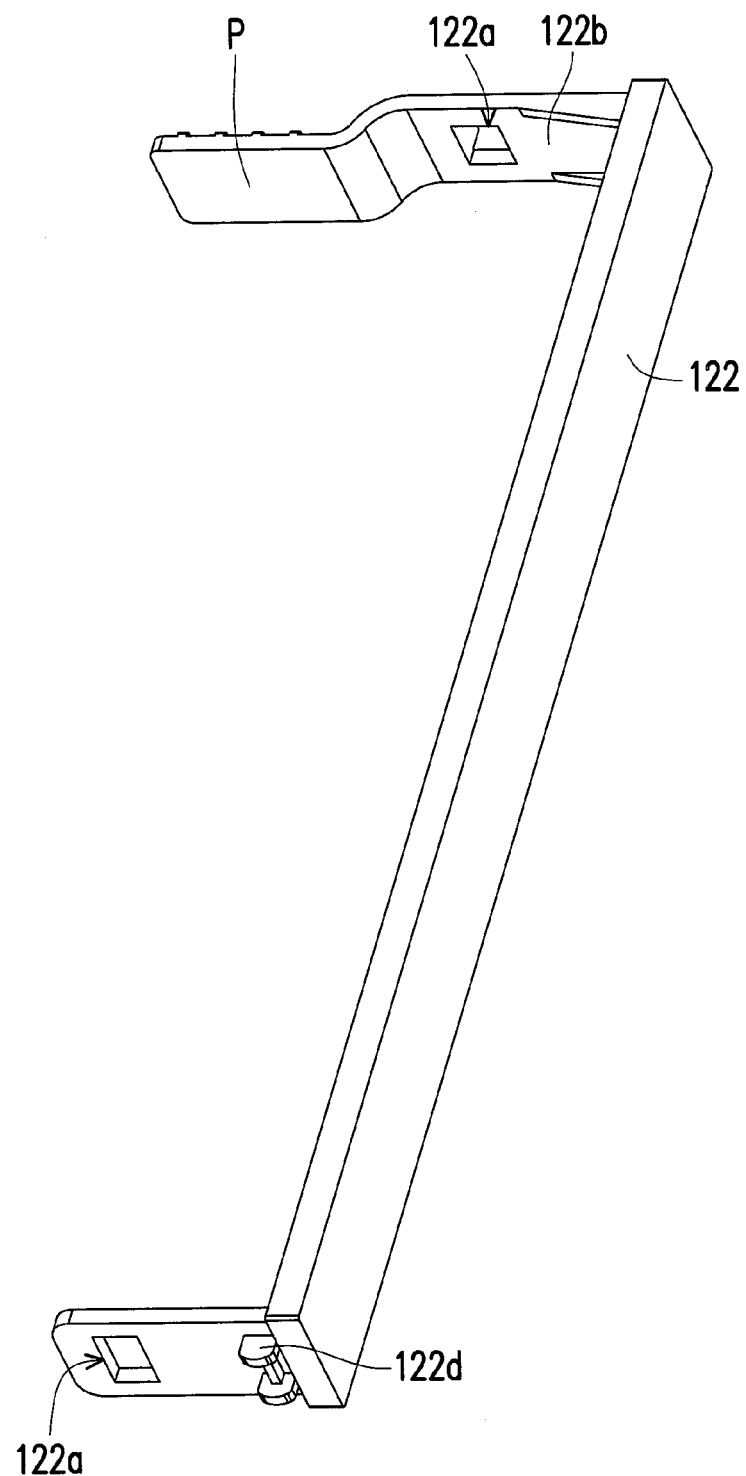
FIG. 6 is a perspective diagram of the cover of FIG. 5.
Figure 7:
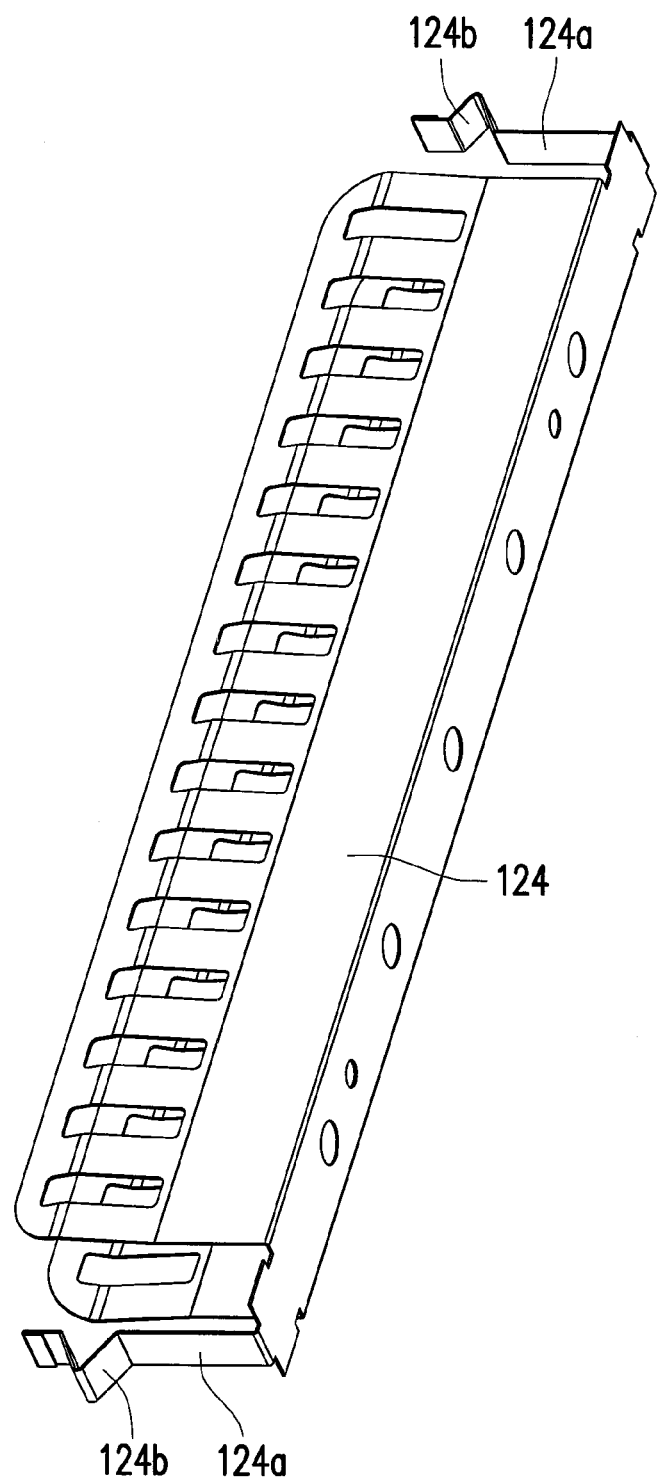
FIG. 7 is a perspective diagram of the conductive component of FIG. 5.

FIG. 4 is a partial cross-sectional diagram of the electronic device of FIG. 1. FIG. 5 is a perspective diagram of the covering structure of FIG. 1. FIG. 6 is a perspective diagram of the cover of FIG. 5. FIG. 7 is a perspective diagram of the conductive component of FIG. 5. Referring to FIG. 4 through FIG. 7, in detail, the covering structure 120 includes a cover 122 and a conductive component 124, and is a composite structure. A material of the cover 122, for example, is plastic, and a material of the conductive component 124, for example, is stainless steel. The cover 122 is assembled to the metal casing 110 and covers the first opening 112 of the metal casing 110. The cover 122 has at least one hole 122a (two are illustrated). The conductive component 124, for example, is fixed to the cover 122 via hot fusing or other appropriate means, and has at least one conductive elastic piece 124a (two are illustrated) and at least one contacting portion 124b (two are illustrated). The contacting portions 124b are separately formed on the conductive elastic piece 124a and separately passing through the holes 122a to contact the metal casing 110 via elastic force of the conductive elastic pieces 124a. Electromagnetic wave generated by the electronic components within the electronic device 100 may pass through the conductive component 124 and be transmitted to the metal casing 110, and electromagnetic wave from the outside may pass through the conductive component 124 and be transmitted to the metal casing 110, so as to prevent the electromagnetic wave generated by the electronic components within the electronic device 100 from causing an interference to the other electronic devices and to prevent the electromagnetic wave of the outside from influencing the normal operation of the electronic device 100.

Figure 8:
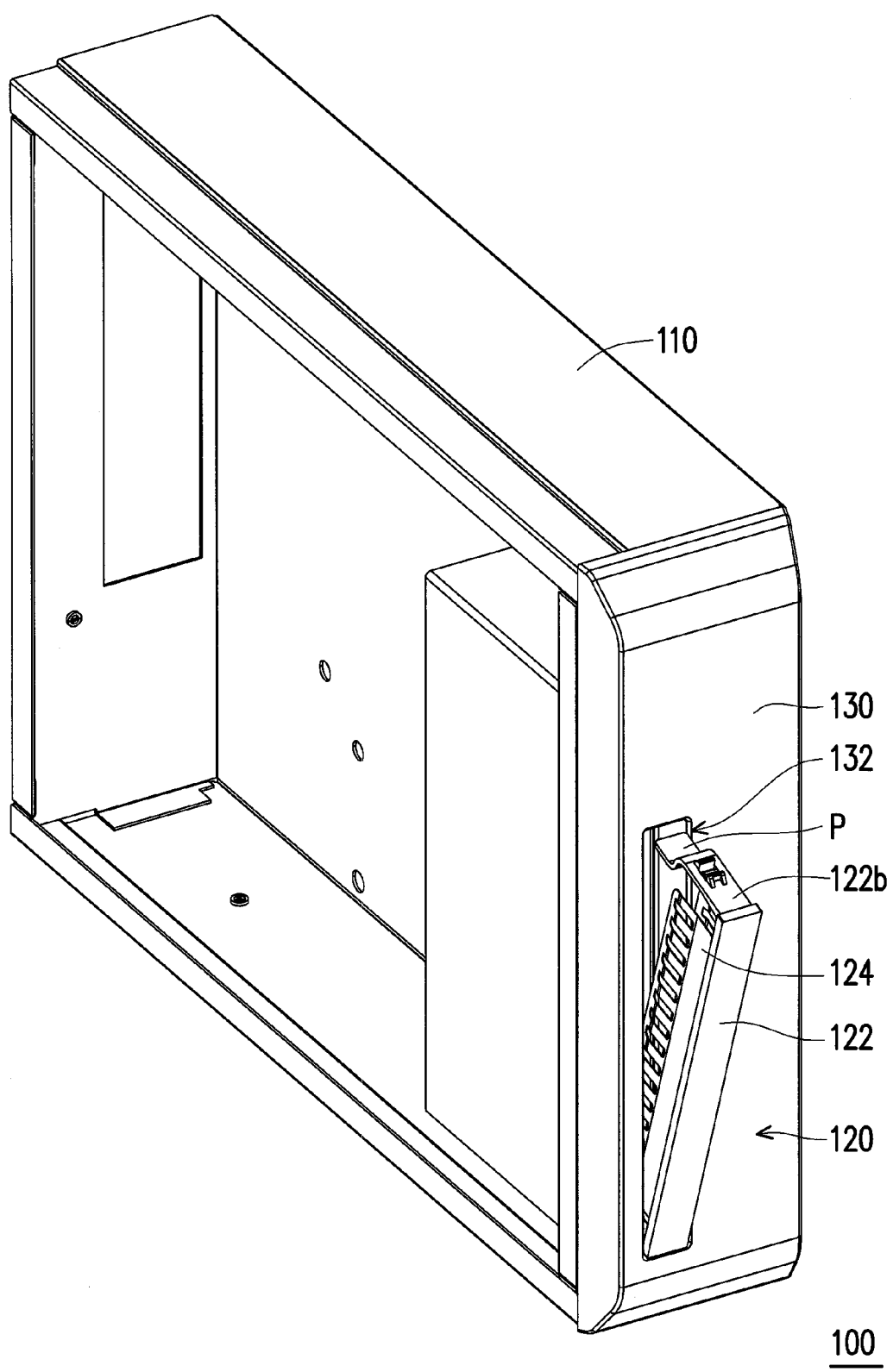
FIG. 8 is a schematic diagram of the covering structure of FIG. 1 being dissembled.
Figure 9:
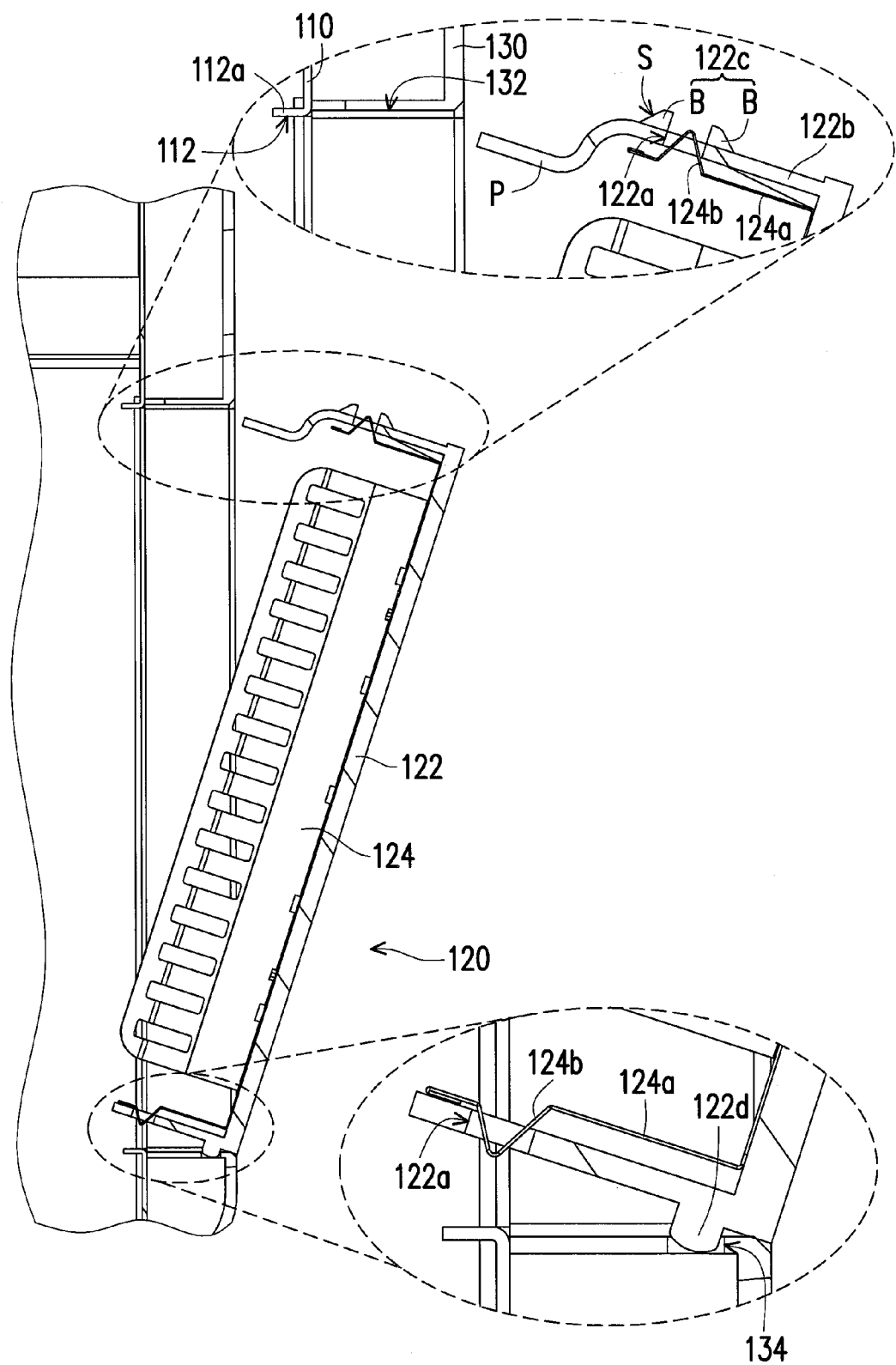
FIG. 9 is a partial cross-sectional diagram of the electronic device of FIG. 8.

FIG. 8 is a schematic diagram of the covering structure of FIG. 1 being dissembled. FIG. 9 is a partial cross-sectional diagram of the electronic device of FIG. 8. Since the conductive component 124, instead of being directly assembled to the metal casing 110, is fixed to the cover 122, and the second opening 132 of the external cover 130 exposes the covering structure 120, when a user is to dissemble and assemble the cover 122 and the conductive component 124, the external cover 130 is not required to be dissembled, the cover 122 fixed to the conductive component 124 may together be removed from the metal casing 110 by merely dissembling the cover 122 from the metal casing 110, as shown in FIG. 8 and FIG. 9, so as to install the optical drive for expansion through the first opening 112, and the conductive component 124 may be completely installed by merely assembling the cover 122 to the metal casing 110, as shown in FIG. 1 and FIG. 4, such that the dissembling and the assembling of the covering structure 120 are relatively easy.

Figure 10:
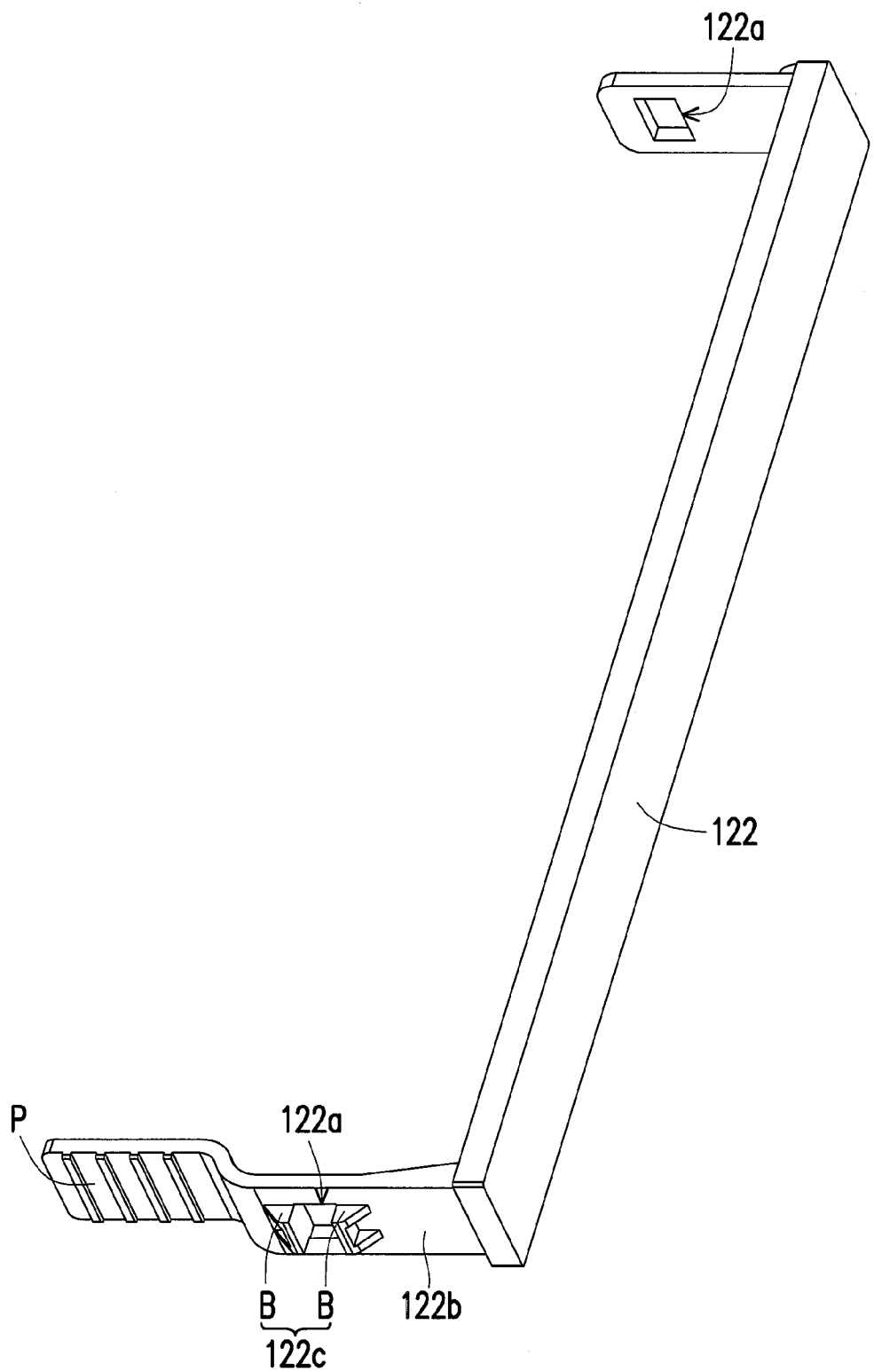
FIG. 10 is a perspective diagram illustrating the cover of FIG. 6 from another viewing angle.

FIG. 10 is a perspective diagram illustrating the cover of FIG. 6 from another viewing angle. Referring to FIG. 4 and FIG. 10, in detail, the cover 122 has an elastic arm 122b and an engagement portion 122c, the engagement portion 122c is formed on the elastic arm 122b and includes two engaging bumps B, and an inner edge 112a of the first opening 112 is engaged between the two engaging bumps B so that the engagement portion 122c is engaged to the metal casing 110. The elastic arm 122b has a pressing portion P, and when the pressing portion P is subjected to a force of user pressing, the elastic arm 122b is elastically deformed and drives the engagement portion 122c to move away from the metal casing 110, so that the user can dissemble the covering structure 120, as shown in FIG. 8 and FIG. 9.

Referring to FIG. 4, the engagement portion 122c of the present embodiment has an inclined guiding surface S and may be engaged to the metal casing 110 with a guidance of the inclined guiding surface S. Specifically, in a process when the user, from a state shown in FIG. 9, covers the covering structure 120 on the metal casing 110, to form a state shown in FIG. 4, the inclined guiding surface S of the engagement portion 122c is being pushed against the external cover 130 and the metal casing 110, and the elastic arm 122b is elastically deformed, so that the engagement portion 122c can be smoothly engaged to the inner edge 112a of the first opening 112.

In the present embodiment, the hole 122a of the cover 122 is formed between the two engaging bumps B, and the contacting portion 124b of the conductive component 124, as shown in FIG. 4, passes through the hole 122a and contacts the inner edge 112a of the first opening 112 of the metal casing 110. In other words, the inner edge 112a of the first opening 112 of the present embodiment, in addition of being configured to be engaged with the engagement portion 122c, is further configured to be in contact with the contacting portion 124b of the conductive component 124, so that the aforementioned electromagnetic wave is transmitted from the conductive component 124 to the metal casing 110 through the inner edge 112a of the first opening 112.

Referring to FIG. 3 through FIG. 5, in the present embodiment, the external cover 130 has at least one positioning hole 134 (two are illustrated), and the cover 122 has at least one positioning protrusion 122d (two are illustrated). The positioning protrusions 122d and the engagement portions 122c are separately located at two opposite ends of the cover 122, and the cover 122, in addition to being engaged to the metal casing 110 through the engagement portions 122c thereof, is also positioned at the positioning hole 134 of the external cover 130 through the positioning protrusions 122d thereof, so that the covering structure 120 is stably assembled to the metal casing 110 and the external cover 130. In addition, the cover 122 can be rotated with the positioning protrusion 122d as a fulcrum to cover the first opening 112 of the metal casing 110, as shown in FIG. 4, or move away from the first opening 112 of the metal casing 110, as shown in FIG. 9, so that the user can smoothly assemble and dissemble the covering structure 120.

In summary, in the covering structure of the invention, the conductive component is fixed to the cover and passes through the hole of the cover to contact the metal casing of the electronic device, so that the electromagnetic wave can be transmitted to the metal casing through the conductive component, thereby achieving the electromagnetic interference shielding effect. When the user is to dissemble and assemble the cover and the conductive component, the external cover is not required to be dissembled, the conductive component fixed to the cover may together be removed from the metal casing by merely dissembling the cover from the metal casing, and the conductive component may be completely installed by merely assembling the cover to the metal casing, such that the dissembling and the assembling the covering structure are relatively easy.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device comprising:
   a metal casing having a first opening; and
   a covering structure comprising:
      a cover assembled to the metal casing and covering the first opening, wherein the cover has two holes opposite to each other and two elastic arms, and the two holes are formed on the two elastic arms and extend through the two elastic arms respectively; and
      a conductive component fixed to the cover and having two contacting portions opposite to each other, wherein the two contacting portions pass through the two holes respectively and contact the metal casing, and an electromagnetic wave is adapted to pass through the conductive component to be transmitted to the metal casing.

2. The electronic device as recited in claim 1, wherein the conductive component has two conductive elastic pieces, and the two contacting portions are formed on the two conductive elastic pieces respectively.

3. The electronic device as recited in claim 1, wherein the cover has an engagement portion, the engagement portion is formed on one of the elastic arms and engaged to the metal casing, and the elastic arm is adapted to be elastically deformed so as to drive the engagement portion to move away from the metal casing.

4. The electronic device as recited in claim 3, wherein one of the elastic arms has a pressing portion, and the pressing portion is adapted to be subjected to a force such that the elastic arm is elastically deformed.

5. The electronic device as recited in claim 3, wherein the engagement portion comprises two engaging bumps, and an inner edge of the first opening of the metal casing is engaged between the two engaging bumps.

6. The electronic device as recited in claim 5, wherein one of the holes is formed between the two engaging bumps, and one of the contacting portions passes through the hole and contacts with the inner edge of the first opening.

7. The electronic device as recited in claim 3, wherein the engagement portion has an inclined guiding surface and is adapted to be engaged to the metal casing through a guidance of the inclined guiding surface.

8. The electronic device as recited in claim 1 further comprising an external cover, wherein the first opening is formed on a surface of the metal casing, the external cover has a second opening and is assembled to the metal casing to cover the surface, and the second opening is aligned to the first opening and exposes the covering structure.

9. The electronic device as recited in claim 8, wherein the external cover has a positioning hole, the cover has a positioning protrusion, and the positioning protrusion is positioned at the positioning hole.

10. The electronic device as recited in claim 9, wherein the cover is adapted to be rotated with the positioning protrusion as a fulcrum to cover the first opening or move away from the first opening.

11. A covering structure adapted to be applied to an electronic device, the electronic device comprising a metal casing, the metal casing having a first opening, the covering structure comprising:
    a cover assembled to the metal casing and covering the first opening, wherein the cover has two holes opposite to each other and two elastic arms, and the two holes are formed on the two elastic arms and extend through the two elastic arms respectively; and
    a conductive component fixed to the cover and having two contacting portions opposite to each other, wherein the two contacting portions pass through the two holes respectively and contact the metal casing, and an electromagnetic wave is adapted to pass through the conductive component to be transmitted to the metal casing.

12. The electronic device as recited in claim 11, wherein the conductive component has two conductive elastic pieces, and the two contacting portions are formed on the two conductive elastic pieces respectively.

13. The electronic device as recited in claim 11, wherein the cover has an engagement portion, the engagement portion is formed on one of the elastic arms and engaged to the metal casing, and the elastic arm is adapted to be elastically deformed so as to drive the engagement portion to move away from the metal casing.

14. The electronic device as recited in claim 13, wherein one of the elastic arms has a pressing portion, and the pressing portion is adapted to be subjected to a force such that the elastic arm is elastically deformed.

15. The electronic device as recited in claim 13, wherein the engagement portion comprises two engaging bumps, and an inner edge of the first opening of the metal casing is engaged between the two engaging bumps.

16. The electronic device as recited in claim 15, wherein one of the holes is formed between the two engaging bumps, and one of the contacting portions passes through the hole and contacts with the inner edge of the first opening.

17. The electronic device as recited in claim 13, wherein the engagement portion has an inclined guiding surface and is adapted to be engaged to the metal casing through a guidance of the inclined guiding surface.

18. The electronic device as recited in claim 11, wherein the electronic device further comprises an external cover, the first opening is formed on a surface of the metal casing, the external cover has a second opening and is assembled to the metal casing to cover the surface, and the second opening is aligned to the first opening and exposes the covering structure.

19. The electronic device as recited in claim 18, wherein the external cover has a positioning hole, the cover has a positioning protrusion, and the positioning protrusion is positioned at the positioning hole.

20. The electronic device as recited in claim 19, wherein the cover is adapted to be rotated with the positioning protrusion as a fulcrum to cover the first opening or move away from the first opening.

\* \* \* \* \*